(12) United States Patent
Lie et al.

(10) Patent No.: US 8,558,625 B1
(45) Date of Patent: Oct. 15, 2013

(54) FREQUENCY TUNING AND PHASE SHIFTING TECHNIQUES USING 1-DIMENSIONAL COUPLED VOLTAGE-CONTROLLED-OSCILLATOR ARRAYS FOR ACTIVE ANTENNAS

(75) Inventors: Yu-Chun Donald Lie, Lubbock, TX (US); Brian Meadows, San Diego, CA (US); Joseph Neff, San Diego, CA (US); John Cothern, San Diego, CA (US); Jerry Lopez, Lubbock, TX (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 72 days.

(21) Appl. No.: 12/943,231

(22) Filed: Nov. 10, 2010

Related U.S. Application Data

(60) Provisional application No. 61/260,871, filed on Nov. 13, 2009.

(51) Int. Cl.
*H03B 5/12* (2006.01)

(52) U.S. Cl.
USPC ............. 331/50; 331/46; 331/48; 331/117 FE

(58) Field of Classification Search
USPC ............. 331/46, 47, 48, 50, 55, 56, 2, 117 R, 331/117 FE, 167; 342/367, 368
See application file for complete search history.

(56) References Cited

U.S. PATENT DOCUMENTS

| | | | |
|---|---|---|---|
| 6,822,522 B1 | 11/2004 | Brown et al. | |
| 6,880,400 B1 | 4/2005 | Fogliatti et al. | |
| 7,109,918 B1 | 9/2006 | Meadows et al. | |
| 7,196,590 B1 | 3/2007 | In et al. | |
| 2002/0093385 A1* | 7/2002 | Nishiyama et al. | 331/46 |
| 2004/0251975 A1* | 12/2004 | Li et al. | 331/46 |

OTHER PUBLICATIONS

J Lopez, D.Y.C. Lie, B.K. Meadows, J. Neff and J. Cothern, "Novel Frequency Tuning and Phase Shifting Techniques Using I-Dimensional Coupled Voltage-Controlled-Oscillator Arrays for Active Antennas", Proc. IEEE MILCOM conf.. San Diego, CA, Nov. 17-19, 2008.

J. Lopez, D.Y.C. Lie. B.K. Meadows, J. Neff and J. Cothern, "A Novel Frequency and Phase Tuning Technique for RF Phase Array Antennas Using Fully Monolithic AC-Coupled I-D Voltage-Controlled-Oscillators Arrays", Proc. IEEE MILCOM conf., pp. 1-7, San Diego, CA, Nov. 17-19, 2008.

(Continued)

*Primary Examiner* — Ryan Johnson
(74) *Attorney, Agent, or Firm* — Kyle Eppele; Stephen E. Baldwin; Peter A. Lipovsky

(57) ABSTRACT

A technique for enhancing the frequency tuning range for monolithic RF source generation using fully-integrated coupled Voltage-Controlled-Oscillator (VCO) arrays that contain an odd number of VCOs. Fully-monolithic SiGe VCO arrays using on-chip inductor and varactor with on-chip bias current sources have been carefully designed and simulated in IBM 7HP 0.18 μm BiCMOS technology and taped out for fabrication. The SPICE simulated frequency and phase tuning of the 1-D VCO×5 array is dependent on the edge VCOs termination impedance, the tuning voltages, and the VCO coupling strength. The simulated data suggests that the enhanced tuning range and beam steering can be accomplished using coupled-VCO arrays without needing complex and bulky phase shifters. This design technique imposes no apparent phase noise penalty but can provide simulated RF frequency tuning range of ~40% and also ~+/−25° beam steering for active antennas applications.

7 Claims, 11 Drawing Sheets

(56) References Cited

OTHER PUBLICATIONS

J. Lopez, D.Y.C. Lie, J. Cothern, J. Neff and B.K. Meadow, "The Design and Analysis of Fully-Monolithic RF Coupled-Voltage-Controlled-Oscillator I-Dimensional Arrays in 0. 18μ SiGe BiCMOS", i-manager's Journal on Electrical Engineering, special issue on "Current Research in Analog Circuits and Signal Processing", vol. 2, Issue 1, Jul.-Sep. 2008.
L. Dauphinee, M. Copeland and P. Schvan, A Balanced 1.5GHz Voltage Controlled Oscillator with an Integrated LC Resonator:, IEEE Intl Solid-State Circuits Conf., Dig., pp. 390-391 (1997).
A. Kral, F. Behbahani and A. A. Abidi, RF-CMOS Oscillators with Switched Tuning:, Proc. IEEE Custom Integrated Circuits Conference (CICC), pp. 555-558 (1998).
J. O. Plouchart, H. Ainspan, M. Soyuer and A. Ruehli, "A Fully-Monolithic SiGe Differential Voltage Controlled Oscillator for 5 GHz Wireless Applications", IEEE Radio Frequency Integrated Circuits Conference (RFIC) Symp. Dig., pp. 57-60 (2000).
J. Craninckx, M. Steyaert, and H. Miyakawa, "A Fully Integrated Spiral-LC CMOS VCO Set with Prescaler for GSM and DCS-1800 Systems", Proc. IEEE Custom Integrated Circuits Conference (CICC), pp. 403-406 (1997).
F. Ellinger and H. Jackel, "38-43 GHz Quadrature VCO on 90 nm VLSI CMOS with Feedback Frequency Tuning", Microwave Symposium Digest, IEEE MTT-S pp. 3-7, Jun. 12-17, 2005.
K. Kwok, J.R. Long, J.J. Pekarik, "A 23-to-29 GHz Differentially Tuned Varactorless VCO in 0.13um CMOS", IEEE Digest of ISSCC Technical Papers, pp. 194-195, Feb. 2007.
Y. Seong-Mo and K.K.O., "Switched Resonators and Their Applications in a Dual-Band Monolithic CMOS LC-Tuned VCO", IEEE Trans. Microw. Theory Techniques, 54, 1, pp. 74-81 (2006).
D.Y.C. Lie X. Yuan, L.E. Larson, T. Robinson, A. Senior, X. Wang, J. Mecke and M. Case, "Phase Noise Analysis of Fully-Integrated Digitally-Tuned Wideband Si/SiGe BiCMOS VCOs", Proc. IEEE Bipolar/BICMOS Circuits and Technology Meeting (BCTM), Monterey, CA, pp. 65-68 (2002).
Y. Qian and T. Itoh, "Progress in Active Integrated Antennas and Their Applications," IEEE Trans. Microw. Theory Tech.,, vol. 46, pp. 1891-1900 Nov. 1998.
X. Guan et al., "A Fully Integrated 24-GHz Eight-Element Phase-Array Receiver in Silicon," IEEE J. of Solid-State Circuits, vol. 39, p. 2311-2320, Dec. 2004.
D.Y.C. Lie and L.E. Larson, "RF-SoC: Technology Enablers and Road Blocks for Single-Chip Wireless RF IC Design", International Journal on Wireless and Optical Communications, vol. 1, No. 1, pp. 1-23 (2003).
R.B. Staszewski, J.L.Wallberg, S. Rezeq, H. Chih-Ming, O. Eliezer, et al. "All-digital PLL and Transmitter for Mobile Phones", IEEE J. of Solid-State Circuits, vol. 40, Issue 12, pp. 2469-2482 (2005).
Z.B. Popovic et al., "A 100-MESFET Planar Grid Oscillator," IEEE Trans. Microw. Theory Tech., vol. 39, pp. 193-200, Feb. 1991.
R.A.York, "Oscillator Array Dynamics with Broadband N-Port Coupling Network," IEEE Trans. Microw. Theory Tech., vol. 42, pp. 2040-2045, Nov. 1994.
M.P. DeLisio and R.A. York, "Quasi-Optical and Spatial Power Combining," IEEE Trans. Microw. Theory Tech., vol. 50, pp. 929-936, Mar. 2002.
J. Lin and T. Itoh, "Active Integrated Antennas," IEEE Trans. Microw. Theory Tech., vol. 42, pp. 2186-2194, Dec. 1994.
S.T. Chew and T. Itoh, "A 2x2 Beam-switching Active Antenna Array," IEEE MTT-S Int. Microwave Symp. Dig., pp. 925-928, May 1995.
T. Heath and K. Wiesenfeld, "Manipulated Synchronization: Beam Steering in Phased Arrays," International Journal of Bifurcations and Chaos, vol. 10, No. 11, pp. 2619-2627 (2000).
R.A.York, "Nonlinear Analysis of Phase Relationships on Quasi-optical Oscillator Arrays," IEEE Trans. Microw. Theory Tech., vol. 41, pp. 1799-1809, Oct. 1993.
A. Georgiadis, A. Collado, and A. Suarez, "New Techniques for the Analysis and Design of Coupled-Oscillator Systems", IEEE Trans. Microwave Theory Tech., vol. 54, 11, Nov. pp. 3864-3877 (2006).

\* cited by examiner

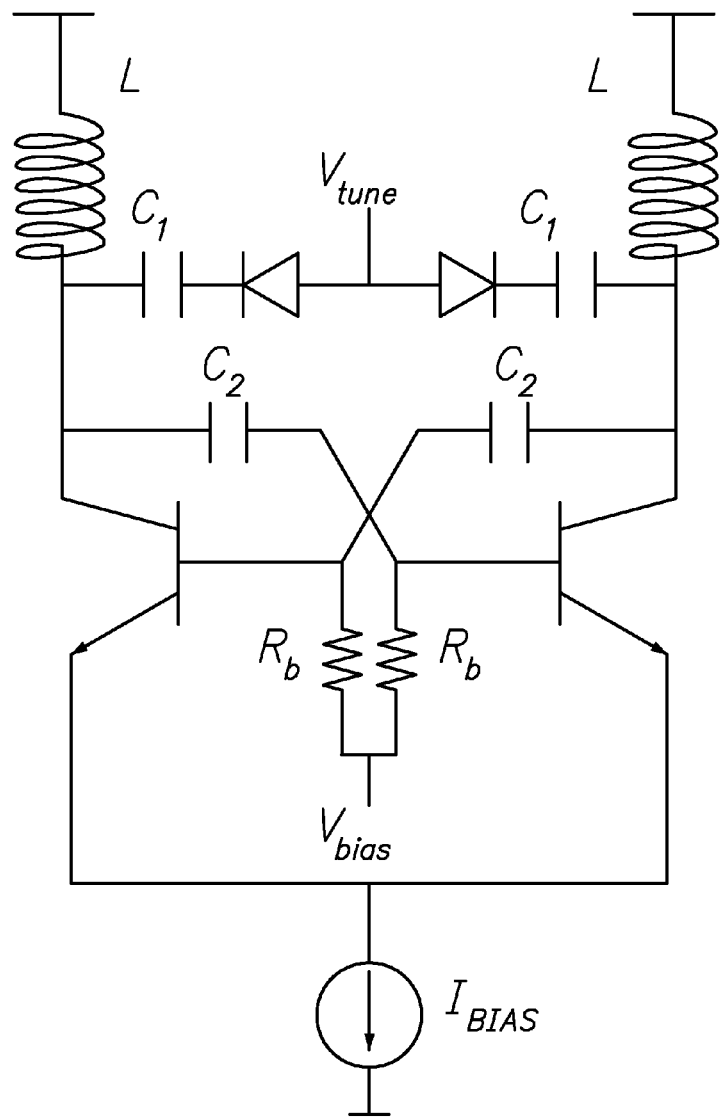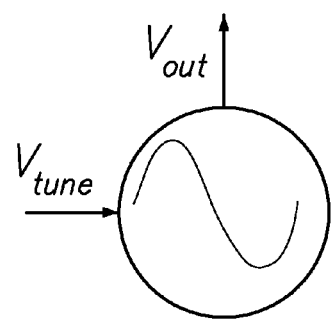
*FIG. 1A*    *FIG. 1B*

FREQUENCY TUNING AND PHASE SHIFTING TECHNIQUES USING 1-DIMENSIONAL COUPLED VOLTAGE-CONTROLLED-OSCILLATOR ARRAYS FOR ACTIVE ANTENNAS

CROSS-REFERENCE TO RELATED PATENT APPLICATIONS

The present application is related to provisional patent application Ser. No. 61/260,871, filed Nov. 13, 2009, entitled FREQUENCY TUNING AND PHASE SHIFTING TECHNIQUES USING 1-DIMENSIONAL COUPLED VOLTAGE-OSCILLATOR ARRAYS FOR ACTIVE ANTENNAS, assigned to the same assignee as the present invention, the details of which are hereby incorporated by reference herein, and priority is claimed herein under 35 USC §119(e).

FEDERALLY-SPONSORED RESEARCH AND DEVELOPMENT

This invention (Navy Case No 100,151) is assigned to the United States Government and is available for licensing for commercial purposes. Licensing and technical inquiries may be directed to the Office of Research and Technical Applications, Space and Naval Warfare Systems Center, Pacific, Code 72120, San Diego, Calif., 92152; voice (619) 553-2778; email T2@spawar.navy.mil.

INTRODUCTION

Voltage-Controlled Oscillators (VCOs) are the essential building blocks of RF frequency synthesizers and System-On-a-Chip (SoC) transceivers: they are the "hearts" of RF wireless systems. Wideband wireless communication typically requires VCOs to have low phase noise, large tuning range, small size, low cost, low power and with high reliability. Fully integrated VCOs are, therefore, highly desirable for both commercial and military communication systems to realize higher levels of system integration with reduced costs and product form factors. Considerable progress has been made recently on monolithic integrated VCO design. However, due to the absence of high quality on-chip varactors, the fully integrated VCOs that utilize on-chip inductor-capacitance (L-C) tanks typically suffer from limited tuning range. To achieve high yield for these monolithic L-C VCOs, they also need to cover the practical lot-to-lot variation in capacitance values (~+/−10%) to ensure the correct VCO output oscillation frequencies.

This means the tuning range of monolithic VCOs have to be greater than ~+/−5%. If the tuning range of an integrated VCO can be made much larger than +/−20%, it could potentially enable this VCO to cover multiband including multi-standard applications (e.g., commercial W-CDMA/EDGE/GSM/ and military Joint Tactical Radio System (JTRS)). Several approaches have been reported in the past to increase the tuning range of monolithic L-C VCOs, such as using large MOS varactors, continuous tuning through coupling strength variation in cross-coupled quadrature VCO (QVCO), on-chip transformer, switched inductors, etc. Recently, the most popular technique probably uses digitally-controlled capacitor banks, which method can widen the tuning range to ~+/−15% without causing significant phase noise degradation, even though tedious calibration may be needed for each band because the frequency tuning are not longer continuous but needs to be switched in discrete bands. Achieving robust continuous frequency tuning range of >+/−20% for monolithic RF VCOs is still very difficult, especially if low phase noise are required for the applications.

The concept of phase-array antennas has been around for several decades. Various active antenna array systems have been used in Department of Defense (DoD) applications with digital signal processing to improve signal reception and anti jamming properties (i.e., smart-antenna systems). Those RF systems are high cost and mostly bulky and complicated in control electronics and matching, making them very difficult to be miniaturized for commercial applications. However, due to the recent technological advancement, there has been a strong interest to integrate phase-array networks in a 'system-on-chip (SoC)' fashion for use in S, C, and X bands. This is because the integration level of RF Integrated Circuits (ICs) has exhibited dramatic progress during the last decade. The push to highest Si integration possible has already happened in the commercial wireless products: Si-based single-chip GSM/GPRS/DCS/PCS, WLAN, Bluetooth and DECT transceivers have all been reported in the past few years.

To achieve this high level of IC integration, one has to choose radio SoC chip architectures that require a minimal number of external components, together with a judicious selection of the IC device technology for implementation. Furthermore, it as become increasingly clear that areas as diverse as signal processing, communication, sensors, lasers, and biomedical anomalies such as epilepsy have a common underlying thread: the dynamics that governs these systems are inherently nonlinear. However, while significant progress in the theory of nonlinear phenomena have been made, there exist comparatively few commercial or military devices that actually designed to take advantage of this nonlinear dynamics.

For example, there have been virtually no publications on RF performance-compliance active antenna using nonlinear dynamics for any wireless standard today, either for military or for commercial use. Our research therefore targets to advance nonlinear dynamics knowledge for realizing state-of-the-art active antenna systems for DoD applications. This research program is to provide a proof-of-concept for the operation of nonlinear active antenna arrays that exploit nonlinear system dynamics using Si-based highly-integrated coupled VCO arrays for improved antenna performance.

A unit cell of such active antennas can be formed by using a nonlinear integrated circuit (i.e., a VCO) to drive a passive antenna element. These "unit cells" are then carefully designed and coupled to one another to form a coupled-VCO array whose operation is intrinsically nonlinear to create the desired properties of the active antenna. The potential of integrating the RF VCO unit cells and nonlinear VCO arrays with coupling elements and RF front-end electronics all into a small receiver IC is particularly attractive as it can, for example, drastically reduce the existing bulky phase array antenna and complex calibration procedures and revolutionize this field phase array antenna. Eventually, we would like to achieve wider frequency bandwidth and tuning range, better receiver sensitivity with lower bit error rate (BER), increased null depth, while simplifying parameter controls. Our research on RF-SoC design and system architectures should also pave the road to miniature single-chip portable wireless SoC ICs for novel DoD applications.

BRIEF DESCRIPTION OF THE DRAWINGS

FIG. 1 (a) shows a simplified circuit schematic of an L-C VCO unit cell and FIG. 1(b) shows a block diagram for the VCO unit cell.

DETAILED DESCRIPTION OF THE PREFERRED EMBODIMENTS

Circuit Design A simplified BJT-based VCO unit cell is shown in FIG. 1. More specifically, FIG. 1 (a) (Left portion) shows a simplified circuit schematics of the L-C VCO with ideal biasing as the basic BJT-based VCO unit cell for the 1-D VCO array design; and FIG. 1(b) (Right portion) shows a block diagram for the VCO unit cell.

This VCO is used as the basis for our 1-D VCO array design. The design utilizes an L-C tank and a crossed-coupled differential pair to generate the negative resistance for oscillation (i.e., a negative gm VCO). A pair of on-chip varactors biased by on-chip resistors are used to tune the L-C VCO oscillation frequency. The unit cell of a fully-integrated VCO and various 1-D VCO arrays have been designed and simulated in IBM 7HP BiCMOS production design kit. The VCO uses on-chip devices such as spiral inductors, MOS accumulation-mode varactors, Metal-Insulator-Metal (MIM) capacitors, several resistors, and high-breakdown/high-$f_T$ bipolar SiGe and CMOS transistors. The simulated VCO exhibits weakly-nonlinear "Van der Pol"-like behavior as the 2nd order harmonics are suppressed to below −100 dBc due to the symmetry of circuit, and the 3rd order harmonics fall below ∼−25 to −45 dBc, making it suitable as a basic unit cell for the 1-D VCO array design.

Figure 2:
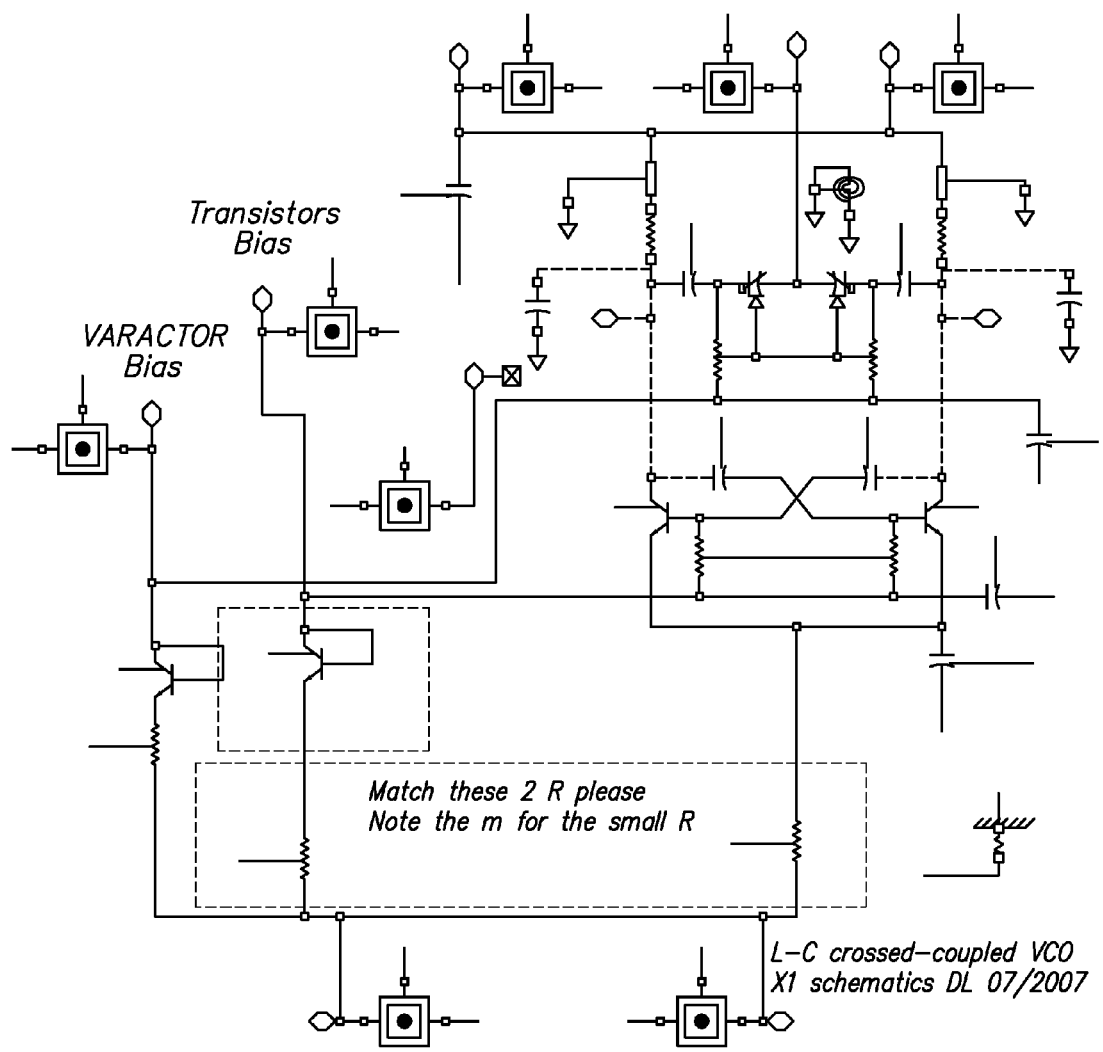
FIG. 2 shows a Cadence SPICE simulation schematic of the L-C VCO with on-chip biasing (a screen capture)

FIG. 2 shows a Cadence SPICE simulation schematic of the L-C VCO with on-chip biasing (a screen capture) The SPICE simulation schematic of the L-C VCO with real on-chip biasing shown in FIG. 2 is for the BJT (Bipolar Junction Transistor) based VCO unit cell. The "transistor bias" node and the "varactors bias" node shown in FIG. 2 are fed with on-chip generated PTAT (Proportional-To-Absolute-Temperature) current source to set up the correct bias level). The varactor's biasing was set up on-chip to be centered around 1.25V so that the Vtune node (not visible here but shown in FIG. 1) can provide the frequency tuning. The transistor bias current is set up on-chip with diodes and matching resistors to provide ∼3.7 mA for the VCO (i.e., the bias current Ibias shown in FIG. 1). Resistors were used here instead of active MOSFET for current biasing to avoid the 1/f and thermal noise from the active devices to be upconverted and degrade the VCO phase noise.

Figure 3:
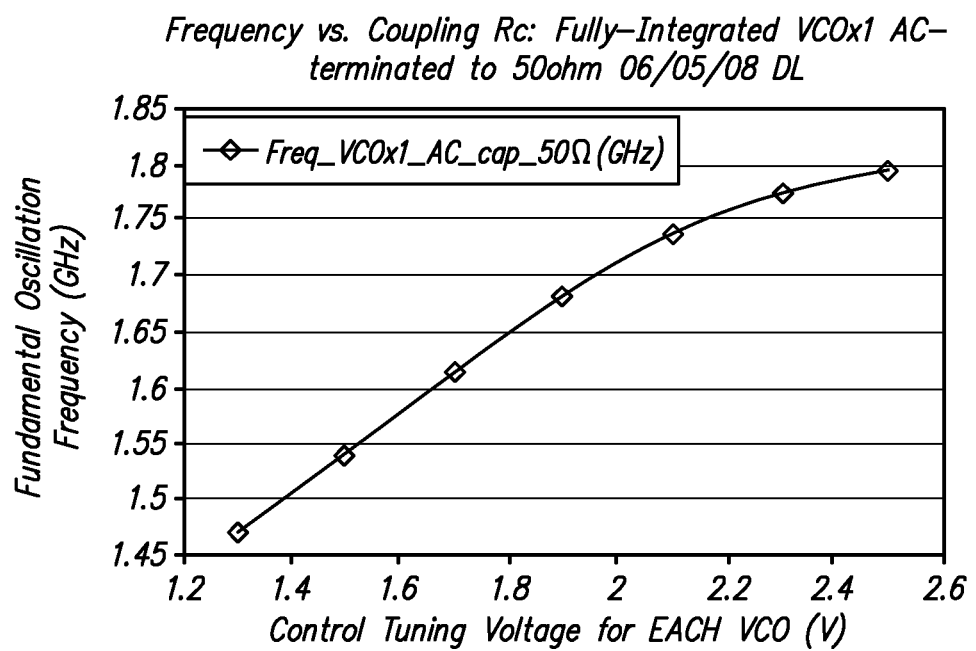
FIG. 3 shows SPICE-simulated oscillation frequency of the fully-integrated VCO unit cell design.

FIG. 3 shows SPICE-simulated oscillation frequency of the fully-integrated VCO unit cell design in IBM's 0.18 μm BiCMOS process. FIG. 3 plots the fundamental oscillation frequency of our fully-integrated VCO unit cell simulated and designed in SPICE using the 0.18 μm IBM 7HP BiCMOS process and design kit. The RF VCO is AC-terminated to a 50 ohm resistor to mimic the realistic RF testing and external antenna loading environment. The effects of parasitics such as capacitance and resistance due to layout interconnect, bondpads, capacitance, and bondwire inductance are included in the simulation testbench. The simulated tuning range is from 1.47-1.79 GHz (i.e., ∼+/−9.8%), which somewhat limited range is expected as we are solely relying on the fully-integrated on-chip MOS varactor to do the frequency tuning. The simulated phase noise with the fully-integrated PTAT current source is around −120 dBc/Hz at 1 MHz offset, which gives a very good FOM of 175-180 for this VCO design. The FOM is achieved by purposely avoiding an active device to set up the bias current for the VCO but instead, adopted on-chip resistors to improve the phase noise by 6-10 dB.

Figure 4:
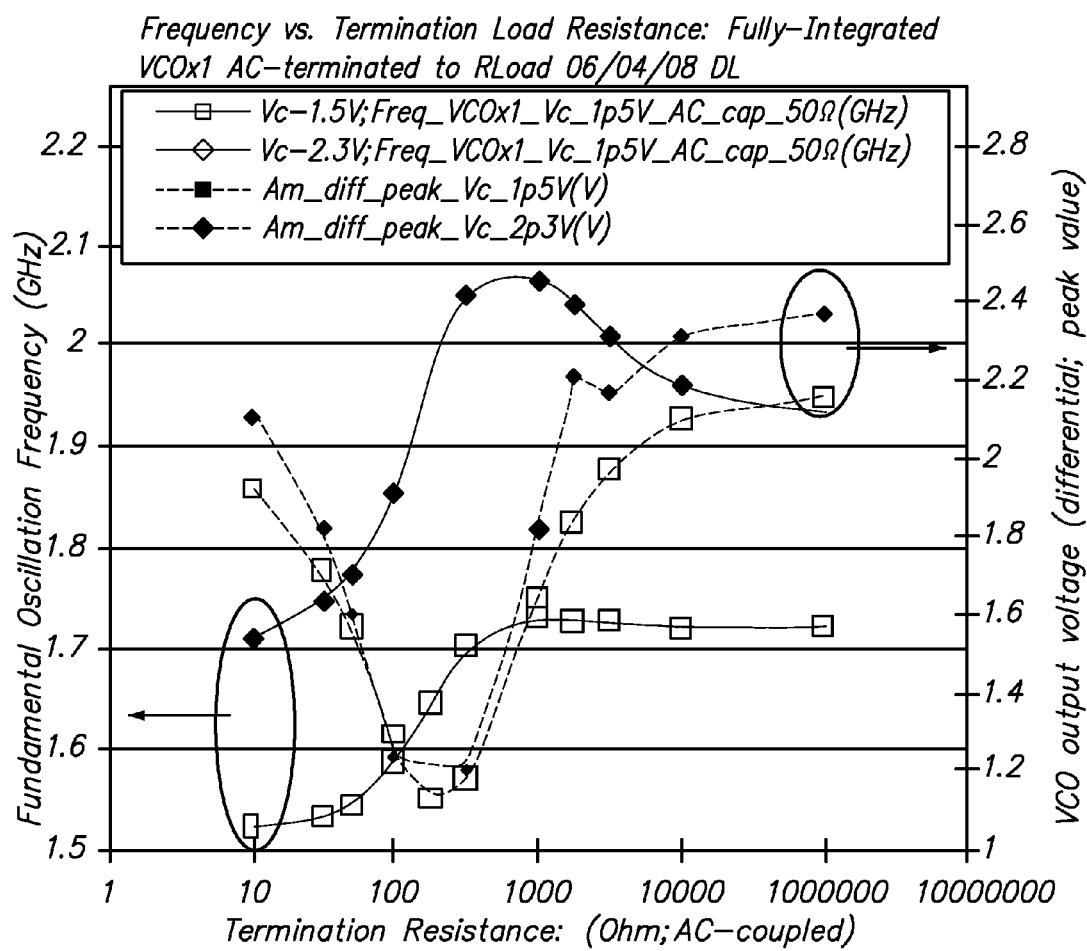
FIG. 4 shows the impact of the AC-terminated load resistance to the fundamental output oscillation frequency and the output voltage.

FIG. 4 shows the impact of the AC-terminated load resistance to the fundamental output oscillation frequency (Left Y axis; solid lines) and the output voltage (Right axis; dotted lines) of our fully-monolithic SiGe VCO unit cell at two tuning voltage of 1.5 and 2.3V.

FIG. 4 illustrates that the impact of the termination resistance to the fundamental oscillation of our fully-integrated VCO unit cell. At a varactor tuning voltage of 1.5V (open squares with solid line; left Y axis), the oscillation frequency increases ∼13% due to the change of termination resistance from 10 to 1 kΩ (i.e., a tuning range of +/−6.5% due to the change of the load resistance). At a higher varactor tuning voltage of 2.3V (closed diamonds with solid lines; left Y axis), the oscillation frequency increases to ∼18.8% as the termination resistance raises from 10Ω to 1 kΩ, while further increase of the load resistance actually reduces the oscillation frequency such that at 100 kΩ, the frequency drops ∼6% from its peak. The effect of the VCO output amplitude due to the load resistance variation (dotted lines; right Y axis), however, is clearly different from those observed on the VCO oscillation frequency change.

One can see from FIG. 4 that as the load resistance starts to increase to a transition point of ∼100Ω, the VCO oscillation frequency starts to peak, while its output voltage has already taken a significant dip. Even though it is not clear to us how to best interpret this phenomena mathematically, this result suggests a complex behavior of VCO output frequency vs. oscillation amplitude due to the loading variation. The data might suggest that weaker oscillation conditions due to non-optimal loading, which is often manifested by lower oscillation amplitudes, can effectively lead to larger variation in its fundamental oscillation frequency even for a VCO unit cell. We shall keep this fact for our VCO unit cell in mind when interpreting the complex oscillation behaviors of coupled-VCO arrays later.

Figure 5A:
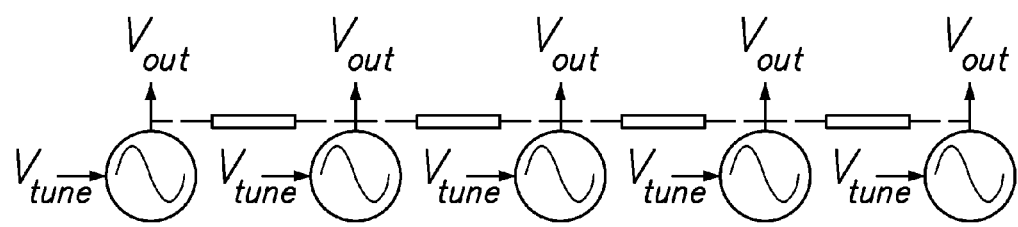
FIG. 5 (a) shows a general system block diagram for the 1-D coupled VCO×5 array.
FIG. 5(b) shows a simplified circuit schematic of the 1-D AC-coupled VCO×5 array.
FIG. 5(c) shows a simplified schematic of the 1-D DC coupled array.
Figure 5B:
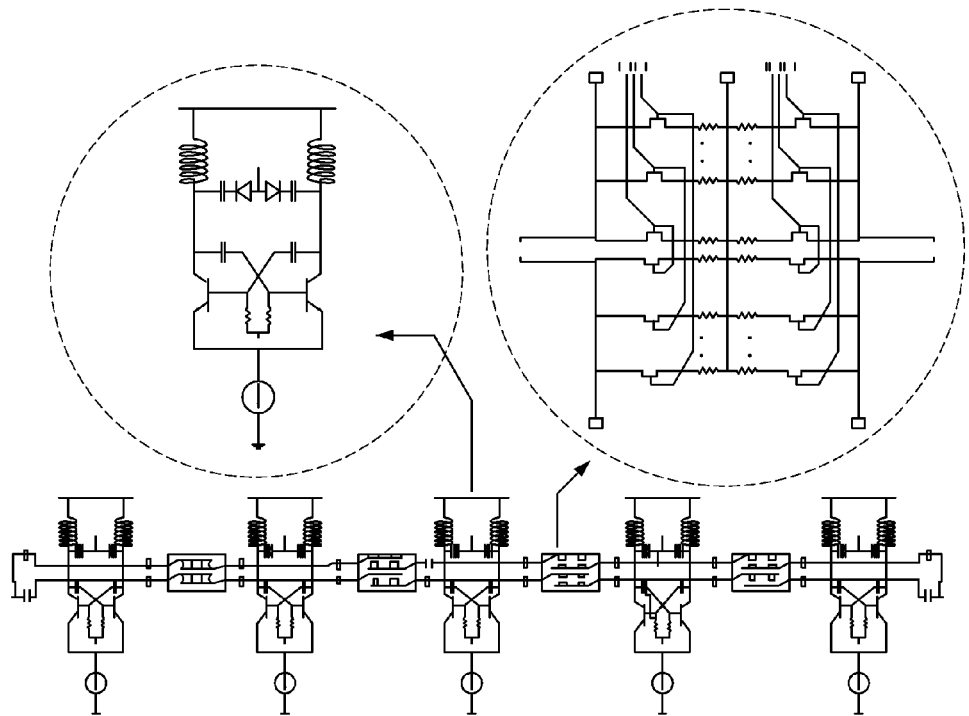

FIG. 5 (a) shows a general system block diagram for our 1-D coupled VCO×5 array (edge termination not explicitly drawn); FIG. 5(b) a simplified circuit schematic of our 1-D AC-coupled VCO×5 array, with a passive (RC) edge termination on the respective edges of the VCO×5 array.

Note the adjacent VCOs in the array can be either "AC-coupled" (i.e., through DC-blocking MIM CAPs and on-chip switchable resistive network) or "DC-coupled" (i.e., through on-chip switchable resistive network but with no DC-blocking caps; also termed "direct-coupled"). FIG. 5(b) is a simplified circuit schematic of our 1-D VCO×5 array that is AC-coupled, where the on-chip coupling network with MOSFET switches is enlarged for clarity.

The schematics of a DC-coupled 1-D VCO×5 array network is the same as that of the AC-coupled network, except that there is no ac-coupling MIM-CAPs between the VCOs. In the remaining of this paper, we will mostly focus our discussions on the DC-coupled 1-D VCO network. Note that for the DC-coupled 1-D VO array, the two edge VCOs are still required to be AC-coupled to the off-chip 50 ohm resistors so that their DC currents would not directly flow through the off-chip 50Ω resistor (i.e., the antenna) to waste power and also kill the oscillation (3V flows through 50Ω is 60 mA, which is a huge waste).

In our simulations and design, the number of VCOs is always an odd number to be consistent with the theory of nonlinear dynamic VCO-coupled-array previously developed by SPAWAR and GTRI. All components of the VCO arrays are integrated on-chip, including an on-chip PTAT bias current cell; the only off-chip element for the VCO array is an off-chip precision resistor that can control the bias current within 1% accuracy under all process-voltage-control (PVT) variation.

The VCOs are designed to be oscillating within the band of ~2 GHz. Initially we had serious convergence problems in Cadence SpectreRF and also ran into memory and network issues. These issues have all been resolved during this period and this advancement can be important as the harmonic-balanced simulators such as ADS appear to struggle from convergence issues while simulating those coupled oscillators and techniques such as models simplification will be needed to resolve these issues.

Figure 6:
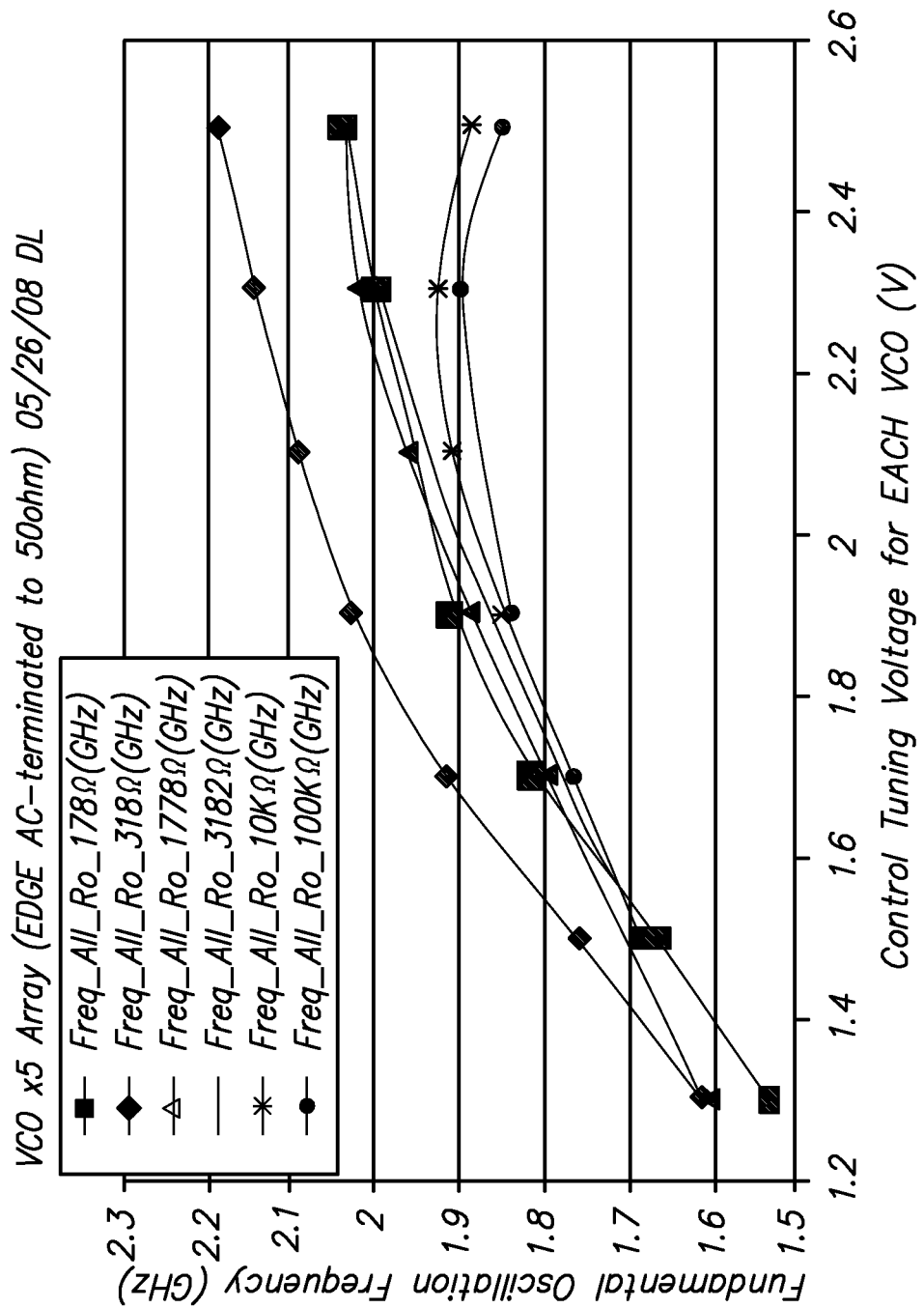
FIG. 6 shows SPICE simulation results of the 1-D DC-coupled VCO array oscillation frequency plotted against the common tuning voltage of each VCO for several coupling resistances.

FIG. 6 shows the SPICE simulation results of oscillation frequencies plotted against the common tuning voltage of each VCO for our 1-D DC-coupled VCO×5 array for several coupling resistors values. Depending on the value of the coupling resistance (therefore the coupling strength), SPICE simulations found that the best tuning range of the 1D couple-VCO arrays can be extended to a much wider +/−20% compared with <+/−10% for the single VCO unit cell (cf. see the case of Rc=316Ω in FIG. 6 vs. FIG. 4).

This wider tuning range can be quite useful for practical applications as discussed before; it is difficult for a monolithic Si VCO to achieve greater than +/−10% continuous tuning range for wideband tuning. Also, for deep-submicron processes, there is a ~+/−20% lot-to-lot capacitance variation, which alone will cause RF VCO oscillation frequency to shift ~+/−5-8% so one needs to have wider than 10% tuning range to compensate for this lot-to-lot variation to achieve reasonable good production yield to save cost. SPICE simulations shows that wider tuning range compared to single VCO unit cell has been observed for 1×3, 1×7 and 1×9 arrays as well.

The coupling network is mainly real and resistive in our design, therefore it presents a broadband nature. Additionally, for the 1×5 1-D VCO array design that was fabricated, the resistive-switching network is able to monolithically switch between coupling elements from 0 to 360Ω, with options for 0Ω, 137Ω, 293Ω, and 360Ω.

By means of this coupling network, the coupling strength from element to element can be varied, thus allowing the tuning frequency and other characteristics of the coupled array to be tuned and adjusted.

Figure 7:
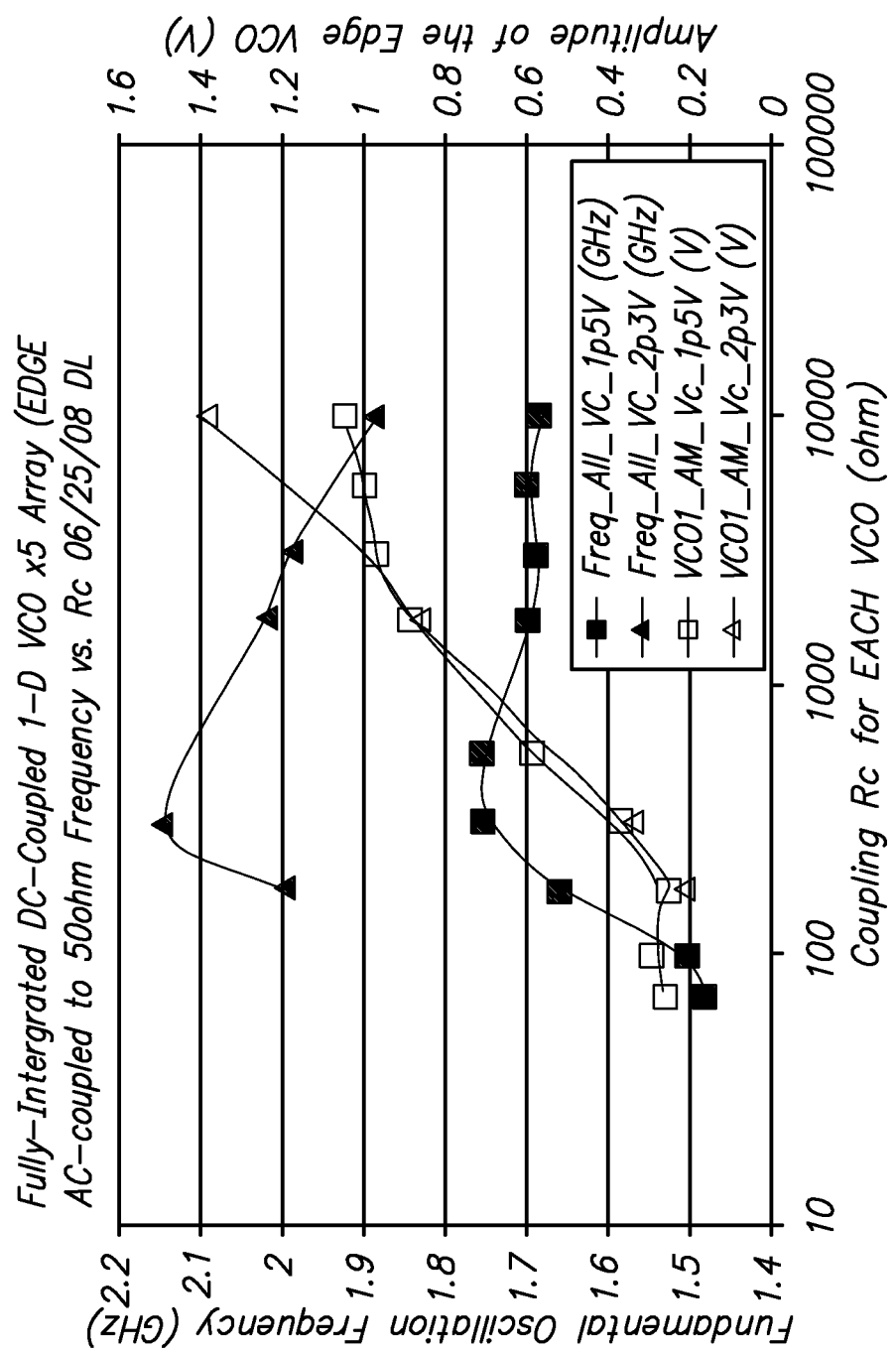
FIG. 7 shows SPICE simulated results of the impact of the coupling resistance values of the 1-D DC-coupled VCO×5 array to the fundamental output oscillation frequency

Similar to what we have observed in FIG. 4, FIG. 7 shows the oscillation frequency of this 1-D, DC-coupled 1×5 VCO array is also strongly dependent on the values of the coupling resistors, which affects the termination loading for each VCO. However, the oscillation frequency of the 1D VCO×5 array does not appear to be dependent on the VCO oscillation amplitudes, or at least their relationship is very different from what we have seen in FIG. 4.

For the 1×5 DC-coupled VCO array, the coupling resistance value still significantly affects its output oscillation frequency, and we can still see a transition region around 100-400Ω where output frequency rises considerably; however, the output amplitude of the DC-coupled VCO array appears increasing monotonically with larger coupling resistance (i.e., weaker coupling). Note that for the case of FIG. 7, the outputs are being taken at the edges only and the frequency effect can be seen across the entire array. This might be explained qualitatively as that when the coupling of the adjacent VCOs becomes weaker, each VCO will be less loaded, contributing to the overall larger oscillating amplitude for the array.

FIG. 7 shows SPICE simulated results of the impact of the coupling resistance values of our 1-D DC-coupled VCO×5 array to the fundamental output oscillation frequency (Left Y axis; solid lines) and the output voltage (Right axis, dotted lines) at two control voltage of 1.5 and 2.3V.

Note that if we also use digital MOSCAPs in the VCO unit cell arranged in a 1-D coupled VCO array, we can increase the tuning range for the overall 1-D VCO array further to over +/−30%, which can be highly desirable. However, we would like to point out that if digital-MOSCAPs are used, the frequency tuning characteristics within each selected band is continuous in nature but there will always need to have overlaps of frequency coverage among the adjacent discrete frequency bands.

These additional MOSCAP banks can be controlled by digital band-select bits, but they must be calibrated carefully, painfully and often very tediously to make sure each VCO is oscillating at the desired frequency band under all process-voltage-temperature variation conditions. This most likely cannot be easily accomplished using a 1-time factor-calibration; therefore, sophisticated adaptive on-chip calibration scheme would have to be employed if the digital MOSCAPs are used. However, in our DC-coupled 1-D VCO array design, the enhanced frequency tuning is accomplished entirely using continuous tuning such that the locking of the phase-lock-loop (PLL) is straight-forward and calibration process becomes much easier, making our enhanced tuning range design methodology much simpler and attractive for implementation.

Figure 8A:
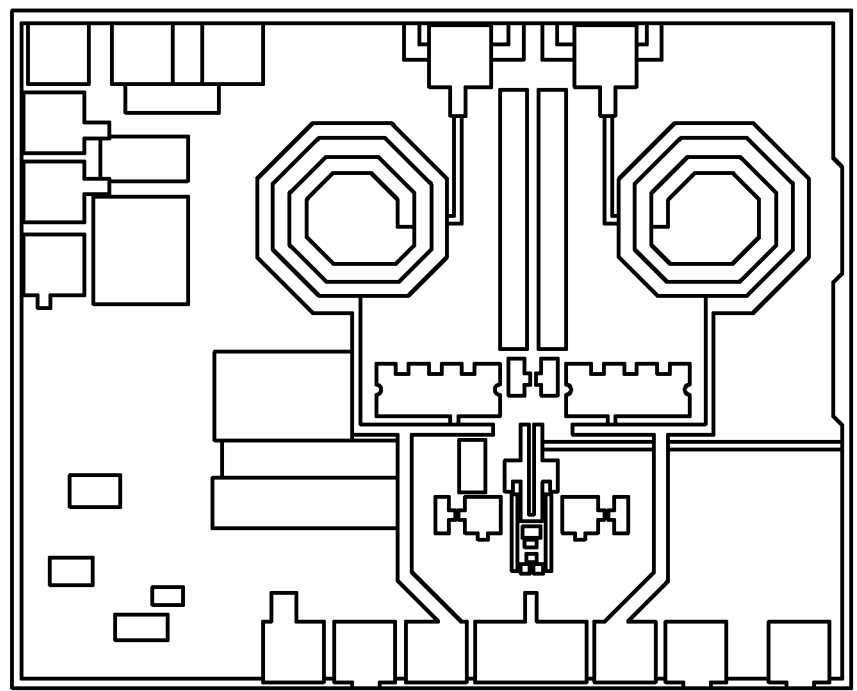
FIG. 8 shows die photographs of (a) VCO unit cell; and (b) three 1-D VCO×5 array networks.
Figure 8B:
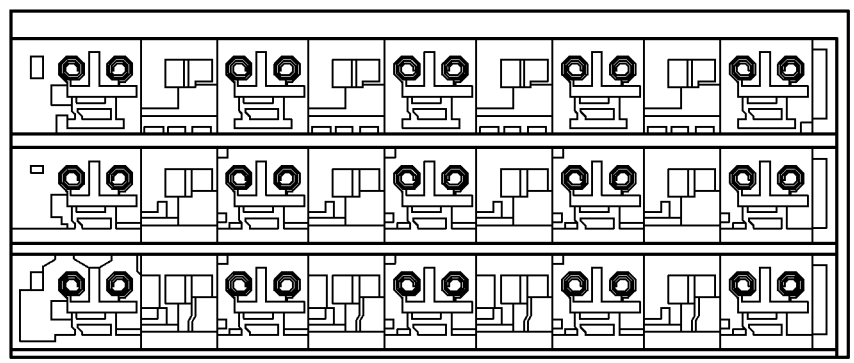

The system presented in FIG. 5 was fabricated and it is being prepared for laboratory testing. Specifically, the VCO unit cells and various 1-D VCO×5 arrays with integrated bias cells have been fabricated in IBM 7HP 0.18 μm BiCMOS process as shown in FIG. 8 below. All the results presented thus far were realized through SPICE simulation and will be verified through hardware in a "chip-on-board" fashion. This, however, is not likely to discredit the conclusions presented here as similar VCO unit cells have been designed and fabricated using this technology many times before.

Specifically, realistic device models used in this design have been utilized countless times and have further shown to corroborate with measurement results of simulated VCO unit cells when the simulation schematics include non-idealities such as layout parasitics and bondwire inductors as previously discussed.

FIG. 8 shows die photographs of (a) a fully-integrated L-C VCO unit cell with on-chip PTAT biasing; (b) three 1-D VCO×5 array networks that can be either DC-coupled or AC-coupled for several on-chip resistors of various values, while each VCO can also be AC-coupled to an off-chip 50Ω termination to mimic the external antenna loading.

Figure 5C:
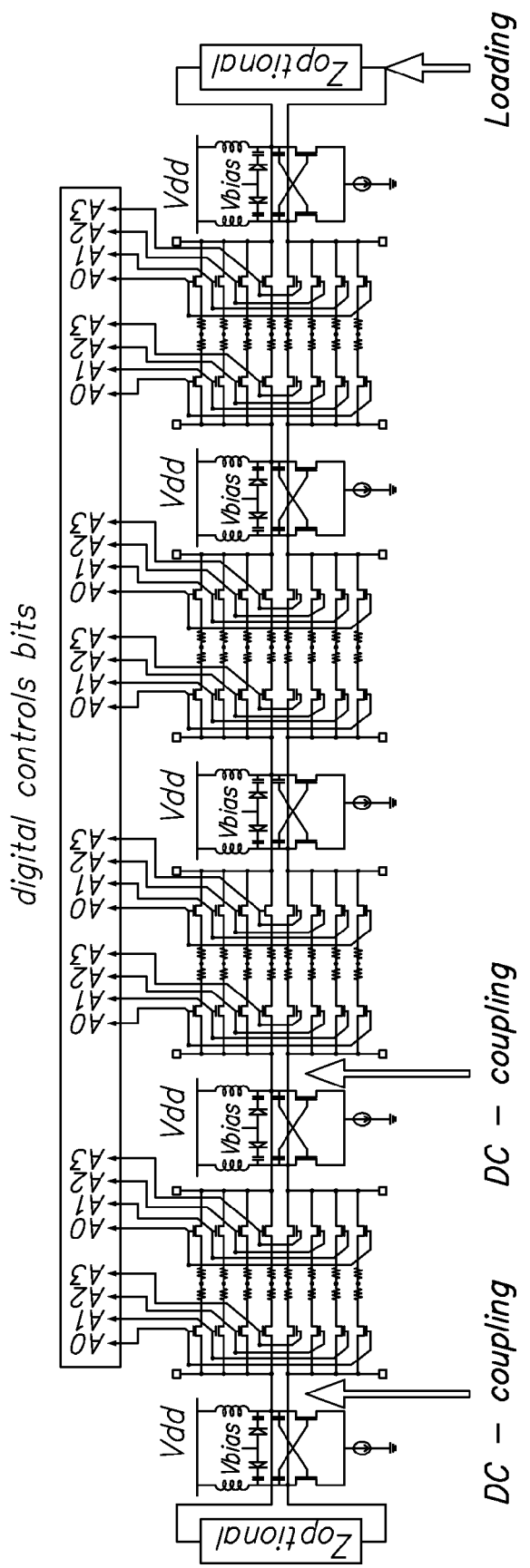

We have reported so far an interesting phenomenon that the tuning range of our DC-coupled and 50Ω-edge-terminated 1-D VCO×5 array is significantly larger than that of a stand-alone VCO (i.e., by a factor of 2), which appears to be a clear sign that nonlinear dynamics is involved in this coupled system. A DC-coupled array is shown in FIG. 5C. Mathematically, the strongly-coupled oscillators will have nonlinear equations almost impossible to solve analytically and must be resort to computer simulations. In any case, this ×2 wider tuning range of the 1-D DC-coupled VCO array is a novel phenomenon, and to the authors' best knowledge, it has never been discussed or reported before and may be quite useful for practical applications.

We will next describe that our 1-D VCO×5 array can not only achieve ×2 enhancement in frequency tuning range, it can also achieve excellent phase tuning for active antenna applications. In this case each VCO can be either AC-coupled or DC-coupled to its nearest neighbor, but each VCO is AC-terminated with a 50Ω resistor to mimic the external antenna loading to deliver the RF output.

Figure 9:
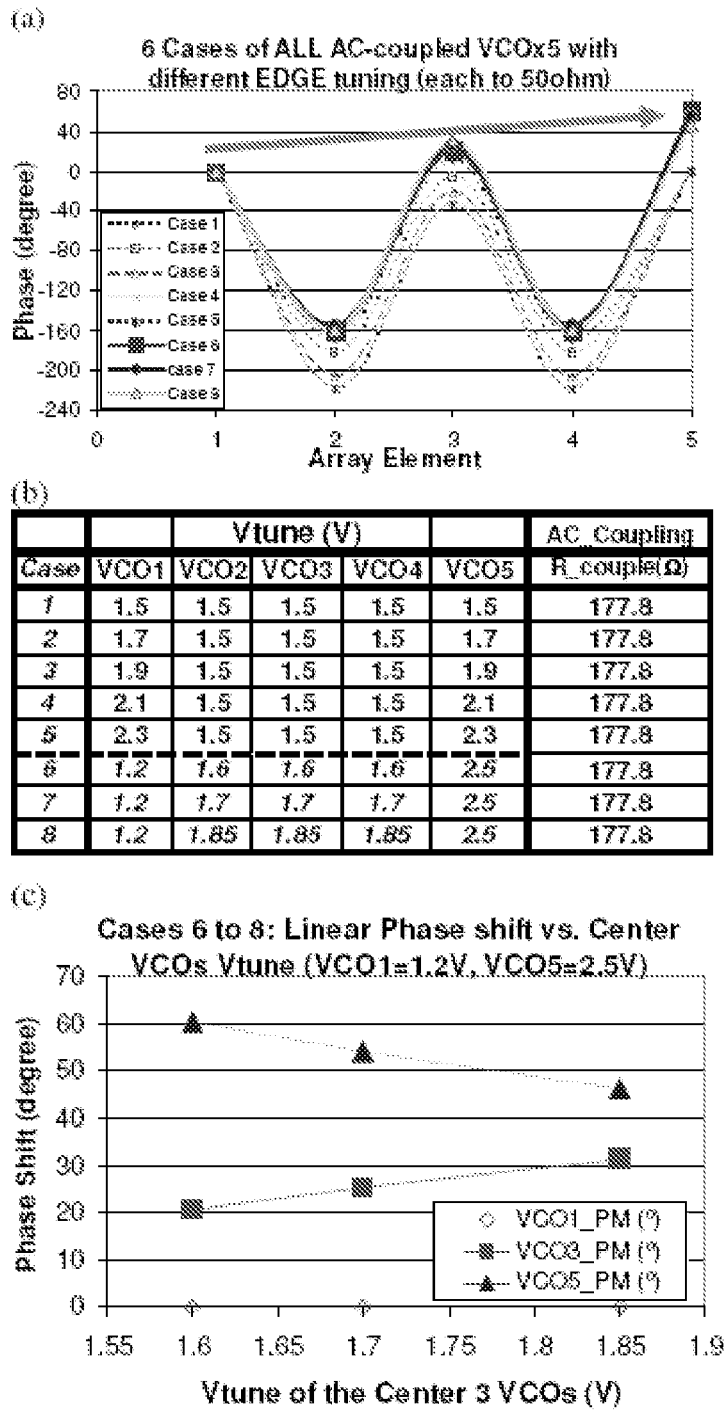
FIG. 9(a) shows SPICE-simulated data: (b) table description for each case; and (c) plot showing how a linear phase shift.

Additionally, the cases of interest is when detuning the edge elements of the array independently while keeping the three center elements at the same tuning voltage (see FIG. 9; cases 6 to 8). In this 'edge-tuning mode", even though there is always the undesired 180° phase shift between the center VCO to its adjacent elements for both AC-coupled and DC-coupled arrays (i.e., VCO3 vs. VCO2 and VCO4), a semi-linear phase change can be presented across the array at elements 1-3-5 and this phase shift can be controlled by means of changing the coupling strength as well as the edge VCOs tuning voltages.

Interestingly, we are proposing to use the designed coupled network to be operated in a three-element-mode, where VCO1, VCO3 and VCO5 are used to do the phase shifts when all non-edge elements are tuned at the same voltage and the edge elements are detuned separately. Taking advantage of this induced phase shift, a beam steering capability can be achieved.

Based on this novel arrangement to use the VCO array, data samples of the element to element achievable phase range in this design are shown in FIG. 9. The arrowed trend line with in FIG. 9 indicates the linear variation trend of the phase in the three elements of interest. To illustrate the case of linear phase variation across the array, the arrow in FIG. 9(a) indicates that cases 6 to 8 exhibits a phasing of 0° at the 1st element, ~26° at 2nd and 52° at 3rd with respect to the 1st element.

Figure 10:
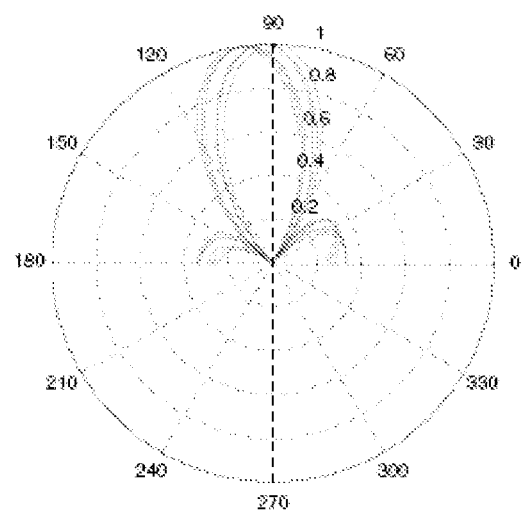
FIG. 10 shows simulated scanning range utilizing 3 elements of the 1-D VCO×5 array.

This linear trend allows a scanning range of nearly ~±15° from broad-side as shown in FIG. 10. Thus, the designed array can be utilized in a broadside scanning/steering mode. Even though SPICE simulation suggests that different values of coupling resistance do not affect the maximum phase shift values a lot, in some cases we have observed a scanning range of nearly ~±25° from broad-side have been achieved by merely manipulating the edge elements tuning (data not shown here).

FIG. 9(a) shows SPICE-simulated data for 8 cases on the edge-tuned 1-D AC-coupled VCO×5 array while keeping the three center elements at the same tuning voltage (i.e., Vtune.); (b) table description for each case; (c) plot showing a linear phase shift is achieved at Vtune~1.75V for the VCO×5 array used in a 3-element mode (VCO1, VCO3, VCO5) with maximum phase shift of ~52°.

FIG. 10 shows simulated scanning range utilizing 3 elements of the 1-D VCO×5 array (i.e., VCO 1-3-5), based on SPICE simulation data from FIG. 9 assuming isotropic radiation with λ/2 element spacing.

CONCLUSIONS

A novel technique that can enhance the frequency tuning range for monolithic RF source generation using fully-integrated coupled VCO arrays has been presented. This design technique imposes no apparent phase noise penalty but can provide ×2 enhancement of RF frequency tuning range. It can also be configured to provide ~+/−25° beam steering from broadside for active antennas applications. The SPICE simulated frequency and phase tuning of the 1-D VCO×5 array is dependent on the edge VCOs termination impedance, the tuning voltages, and the VCO coupling strength. The simulated data suggests nonlinear dynamics is involved, which helps to accomplish the enhanced tuning range and beam steering without needing complex phase shifters. To probe further, this coupled-oscillator design technique might be applicable for non-LC VCO designs as well to enable exciting new DoD applications for wideband phase array antenna.

From the above description of the present invention, it is apparent that various techniques may be used for implementing the concepts of without departing from its scope. The described embodiments are to be considered in all respects as illustrative and not restrictive. It should also be understood that system 10 is not limited to the particular embodiments described herein, but is capable of many embodiments without departing from the scope of the claims.

What is claimed is:

1. An RF VCO array for active antennas, the VCO array comprising:
    multiple non-linear VCO unit cells arranged in one dimension on a monolithic chip, each VCO unit cell including
        a generator circuit for generating a negative resistance VCO oscillation frequency range; and
        a tuner circuit for tuning the VCO oscillation frequency range;
    the VCO unit cells DC-coupled to one another, in a nearest neighbor configuration, through an impedance-coupling network of coupling elements each having a variable VCO coupling strength, to allow the VCO array to be frequency and phase tuned by varying the VCO coupling strength independently between VCO unit cells; and
    a passive edge termination circuit coupled to the respective edges of the VCO unit cell arrangement for controlling the tuning range of VCO operating frequencies.

2. The VCO array of claim 1 wherein the RF tuning range is increased in the range of 10-15%.

3. The VCO array of claim 2 wherein the passive edge termination circuit is AC coupled to provide AC-coupled load resistance.

4. The VCO array of claim 3 wherein the generator circuit includes an on-chip L-C tank circuit and a cross-coupled differential pair.

5. The VCO array of claim 4 wherein the tuning circuit includes a pair of on-chip varactors biased by on-chip resistors.

6. The VCO array of claim 2 wherein the passive edge termination circuit is DC coupled.

7. A method in an RF VCO array for active antennas including a VCO array comprising multiple non-linear VCO unit cells arranged in one dimension on a monolithic chip where each VCO unit cell includes means for generating a negative resistance VCO oscillation frequency range and tuning means for tuning the VCO oscillation frequency range and where the VCO unit cells are DC-coupled to one another, in a nearest neighbor configuration, through an impedance-coupling network of coupling elements each having a variable VCO coupling strength, the method comprising varying the VCO coupling strength independently between VCO unit cells to allow the VCO array to be frequency and phase tuned, and controlling the tuning range of VCO operating frequencies by adjusting passive edge termination means coupled to the respective edges of the VCO unit cell arrangement.

* * * * *